(12) United States Patent
Killer et al.

(10) Patent No.: US 7,998,797 B2
(45) Date of Patent: Aug. 16, 2011

(54) SEMICONDUCTOR DEVICE

(75) Inventors: Thomas Killer, Hohenschambach (DE); Erich Syri, Wenzenbach (DE); Gerold Gruendler, Regensburg (DE); Juergen Hoegerl, Regensburg (DE); Volker Strutz, Tegernheim (DE); Hermann Josef Lutz, Langweid (DE)

(73) Assignee: Infineon Technologies AG, Neubiberg (DE)

( * ) Notice: Subject to any disclaimer, the term of this patent is extended or adjusted under 35 U.S.C. 154(b) by 426 days.

(21) Appl. No.: 12/330,676

(22) Filed: Dec. 9, 2008

(65) Prior Publication Data
US 2010/0140785 A1 Jun. 10, 2010

(51) Int. Cl.
*H01L 21/00* (2006.01)
*H01L 23/12* (2006.01)

(52) U.S. Cl. ........ 438/125; 438/121; 438/122; 257/701; 257/706; 257/E23.078; 257/E23.177

(58) Field of Classification Search .................. 257/276, 257/625, 706, 707, 712–722, 796, E33.075, 257/E31.131, E23.051, E23.08–E23.113, 257/693, 701, 778, E23.01, E21.502, E21.506, 257/E31.041, E27.111; 361/600, 679.01, 361/748; 438/106, 108, 121, 122, 125, 155
See application file for complete search history.

(56) References Cited

U.S. PATENT DOCUMENTS

| | | | |
|---|---|---|---|
| 5,724,230 A * | 3/1998 | Poetzinger | 361/758 |
| 2002/0056570 A1 | 5/2002 | Briar et al. | |
| 2002/0121693 A1 | 9/2002 | Milla et al. | |
| 2006/0001130 A1 | 1/2006 | Islam et al. | |
| 2006/0068576 A1 | 3/2006 | Burdick, Jr. et al. | |
| 2007/0126094 A1 | 6/2007 | Shojaie et al. | |
| 2008/0003780 A1 | 1/2008 | Sun et al. | |
| 2008/0079461 A1 | 4/2008 | Lin et al. | |

FOREIGN PATENT DOCUMENTS

JP 112200055 A 8/1999

OTHER PUBLICATIONS

Brunnbauer et al., "Embedded Wafer Level Ball Grid Array (eWLB)," 2006 Electronics Packaging Technology Conference, Copyright 2006, 5 pages.
"Sanmina-Sci Manufacturers World's First Prototype Printed Circuit Board with 100 Percent Embedded ESD Protection," Sanmina-Sci Press Release, San Jose, CA., Aug. 8, 2007, 3 pages.

* cited by examiner

*Primary Examiner* — Jasmine J Clark
(74) *Attorney, Agent, or Firm* — Dicke, Billig & Czaja, PLLC (57) ABSTRACT

A method of assembling a semiconductor device includes providing a chip attached to an elastic carrier, and supporting the elastic carrier with a stiffener. The method additionally includes removing the stiffener from the elastic carrier after attaching the elastic carrier to a board.

25 Claims, 7 Drawing Sheets

SEMICONDUCTOR DEVICE

BACKGROUND

Semiconductor devices include one or more semiconductor chips having connections that are protectively enclosed in a package, for example by encapsulation material and/or mold compound. Semiconductor packages are commonly employed in a wide range of electronic devices, such as mobile devices, and in a wide variety of applications, including telecommunication and automotive applications. The semiconductor packages are typically connected to a circuit board of the electronic device, for example by solder balls or other connectors.

During use, the semiconductor package generates heat that has the potential to induce stress between the chip and the package and between the package and the circuit board. The coefficient of thermal expansion (CTE) for the semiconductor chip is generally different than the CTE for the package substrate and the encapsulation/mold material of the semiconductor package. The CTE of the semiconductor package is generally different than the CTE of the circuit board to which the package is installed. During use, the thermal changes have the potential to stress the connections between the chip and the package and between the package and the circuit board. The difference in the CTE for these components can potentially result in loss of electrical connection or in poor electrical connection due to stress-induced fatigue cracks at the connections. In addition, mechanical shock that arises when a mobile electronic device is dropped has the potential to detach the solder connections between the semiconductor package and the circuit board.

It is desirable to provide semiconductor packages that are resistant to CTE-induced thermal stresses and mechanical shock. For these and other reasons there is a need for the present invention.

SUMMARY

Embodiments provide a method of assembling a semiconductor device. The method includes providing a chip attached to an elastic carrier, and supporting the elastic carrier with a stiffener. The method additionally includes removing the stiffener from the elastic carrier after attaching the elastic carrier to a board.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a semiconductor device mounted to an elastic carrier, and a stiffener configured to enable handling of the flexible semiconductor device. The elastic carrier typically has a modulus of elasticity between approximately 2-12 kN/mm$^2$ such that the semiconductor device flexes when stressed, which minimizes stress-induced cracking and fatigue of electrical connections. The stiffener supports the highly flexible carrier/device and is configured to be removed from the elastic carrier after mounting the flexibly mounted semiconductor device to a board.

Generally, the elastic carrier is configured to maximize strain (i.e., movement) between the semiconductor chip and the circuit board. In one embodiment, the carrier has elasticity that is sufficient to maximize strain between the semiconductor chip and the circuit board to which the elastic carrier is connected.

Embodiments provide a method of assembling a semiconductor device mounted to an elastic carrier, and a method of handling, with a stiffener, a semiconductor device mounted to an elastic carrier.

Figure 1:
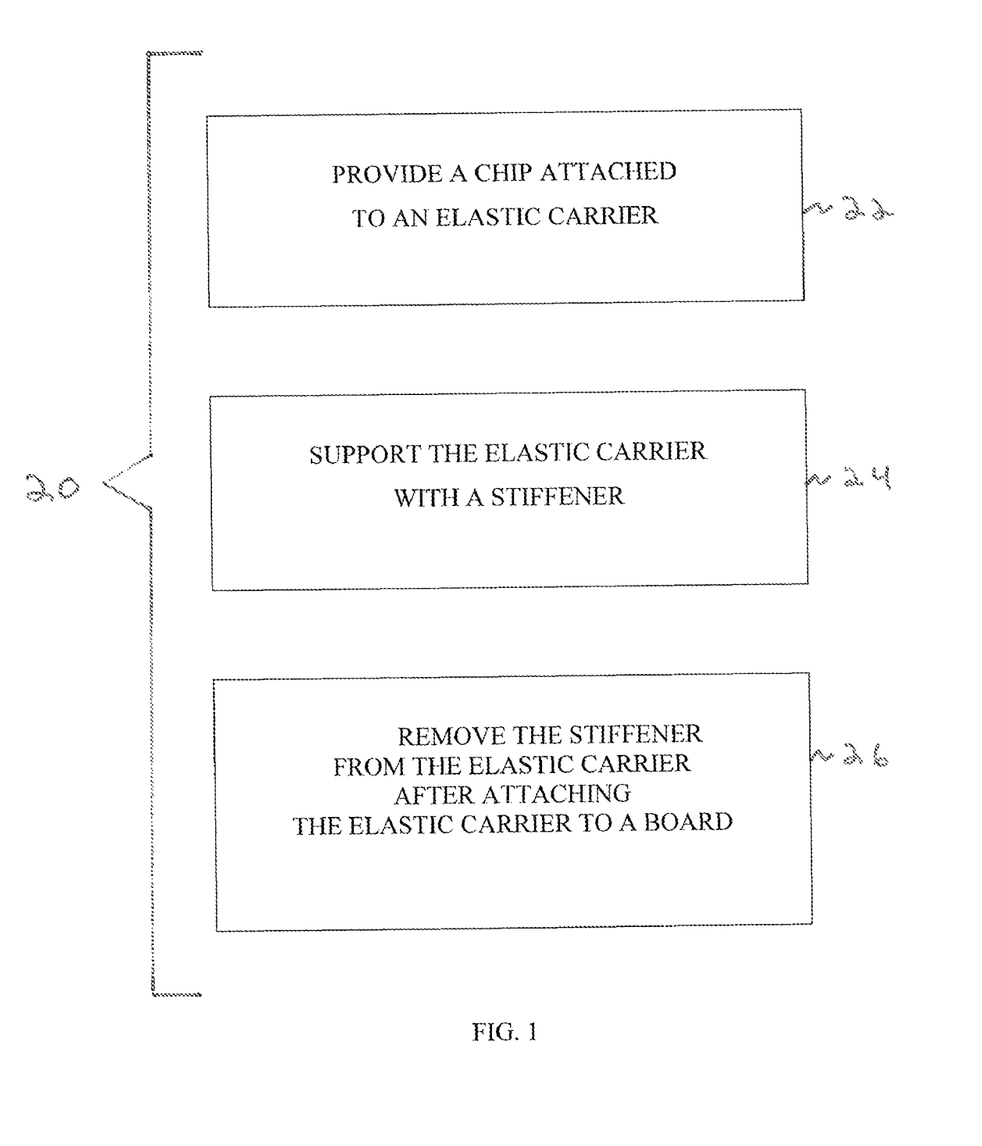
FIG. 1 is a block diagram of a method of assembling a semiconductor device according to one embodiment.

FIG. 1 is a block diagram of a process 20 for assembling a semiconductor device according to one embodiment. Process 20 includes at 22 providing a chip attached to an elastic carrier. At 24, process 20 provides supporting the elastic carrier with a stiffener. At 26, process 20 provides removing the stiffener from the elastic carrier after attaching the elastic carrier to a board.

Figure 2:
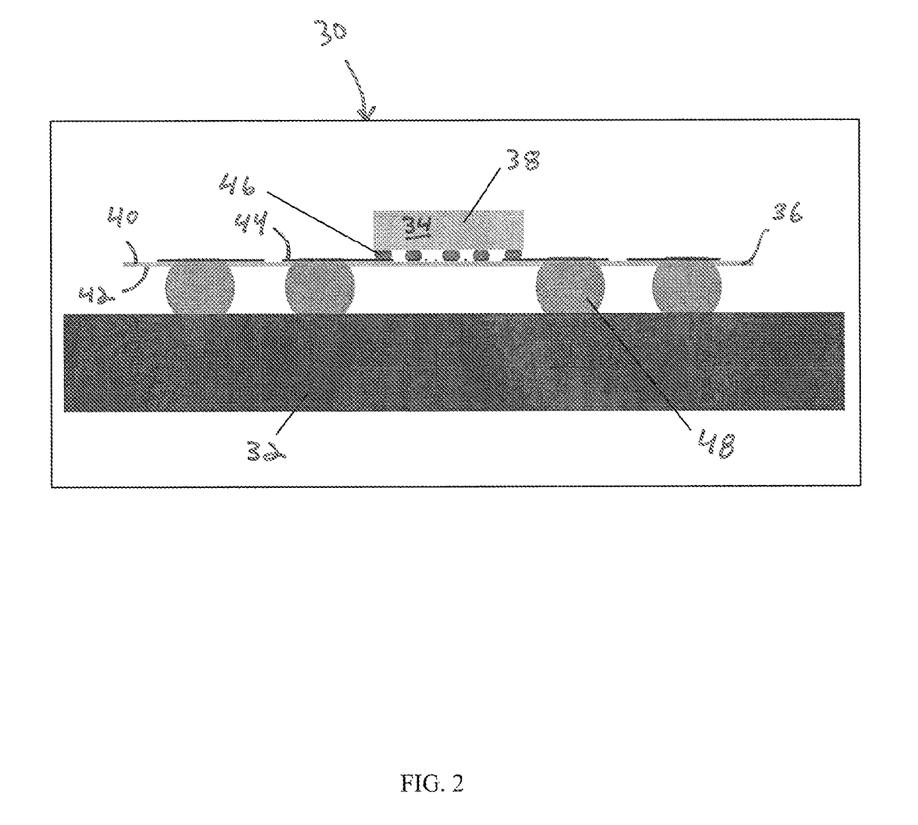
FIG. 2 is a schematic side view of a semiconductor device including a chip attached to an elastic carrier that is attached to a board according to one embodiment.

FIG. 2 is a schematic side view of a semiconductor device 30 according to one embodiment. Semiconductor device 30 includes a board 32 and a semiconductor component 34 attached to an elastic carrier 36 and communicating with board 32. In one embodiment, semiconductor component 34 includes one or more semiconductor chips 38 in electrical communication with board 32.

Board 32 includes leadframes, lead plates, a rigid electronic substrate, a circuit board, or other suitable electronic base to which a semiconductor device is attached. One suitable board 32 includes a printed circuit board as employed in telecommunication applications.

Semiconductor component 34 includes semiconductor packages provided with one or more semiconductor chips. Suitable semiconductor components 34 and chips 38 include integrated circuits configured as logic circuits, control circuits, microprocessors, or microelectrical-mechanical components. In one embodiment, chips 38 include power semiconductor chips such as power transistors, power diodes, insulated gate bipolar transistors (IGBT), etc. In one embodiment, chips 38 include a vertical structure (a Z-directional structure) configured such that electric current flows in the Z-direction perpendicular to the main surfaces of semiconductor component 34. In one embodiment, component 34 is a flip chip 38 including a solder connection to elastic carrier 36. In one embodiment, component 34 includes passive devices e.g. capacitors, resistors and/or inductors and/or additional already housed semiconductor devices. In one embodiment, component 34 includes a battery or/and energy harvesting device. In one embodiment, component 34 includes an antenna and/or input keys and/or output actuators (e.g. buzzer) and/or optical units (e.g. LED, display). In one embodiment, component 34 includes a connector for external connections.

Embodiments of the semiconductor device 30 and processes for fabricating the semiconductor device 30 are compatible with flip chips, wire bonded chips, multi-chip packages, and other suitable semiconductor devices configured to be electrically connected to a board.

Elastic carrier 36 includes flexible films, elastic films, polymer foils such as a polyimide foil provided with conductive strips, or other flexible substrates. In general, elastic carrier 36 is provided with a modulus of elasticity between approximately 2-12 kN/mm$^2$. Elastic carrier 36 is configured to be flexible such that a stress applied to the elastic carrier 36 results in a strain (movement, or change in dimension). In one embodiment, carrier 36 is elastic such that carrier 36 strains when stressed and recovers to its original dimension when the stress is removed.

One suitable carrier 36 includes a soft polyimide foil having a thickness between about 30-80 micrometers. One suitable carrier 36 includes a polyimide film available from 3M Company, Saint Paul, Minn. and identified as 3M™ 92 polyimide film. In one embodiment, carrier 36 stretches to elongate between 5-50 percent.

In one embodiment, carrier 36 includes a first face 40 opposite a second face 42 and is provided with one or more electrically conductive contact pads 44 or contact strips 44. In one embodiment, semiconductor chip 38 is electrically connected to pads 44 with chip contacts 46, and carrier 36 is electrically connected to board 32 with external contacts 48. In one embodiment, chip contacts 46 include flip chip contacts or solder balls, and external contacts 48 include ball grid arrays or solder balls.

Carrier 36 is flexible and configured to enable chip 38 to move relative to board 32. Movement of chip 38 due to thermal or mechanical stress is accommodated and/or mitigated by carrier 36 that permits chip 38 (and chip contacts 46) to move relative to board 32. In addition, flexible carrier 36 moves relative to external contacts 48 in a manner that has been discovered to be extraordinarily insensitive to mechanical shock. For example, in one embodiment carrier 36 is provided as a polyimide flexible substrate about 50 micrometers thick having a modulus of elasticity of about 5 kN/mm$^2$, which enables chip 38 to move relative to board 32 in a manner that minimizes cracking of chip contacts 36 and external contacts 48.

In contrast, conventional carriers (sometimes provided as glass-fiber reinforced epoxy resin substrates) are generally inflexible and easier to handle, having a modulus of elasticity of approximately 20 kN/mm$^2$ with a typical thickness of about 500 micrometers. Thus, carrier 36 is significantly softer and more flexible than the conventional carrier.

The flexibility of carrier 32 enables movement of chip 38 relative to board 32. It is desirable to provide a method and an apparatus to handle the flexibly mounted chip 38 for quality assurance testing and installation to other electronic devices.

Figure 3:
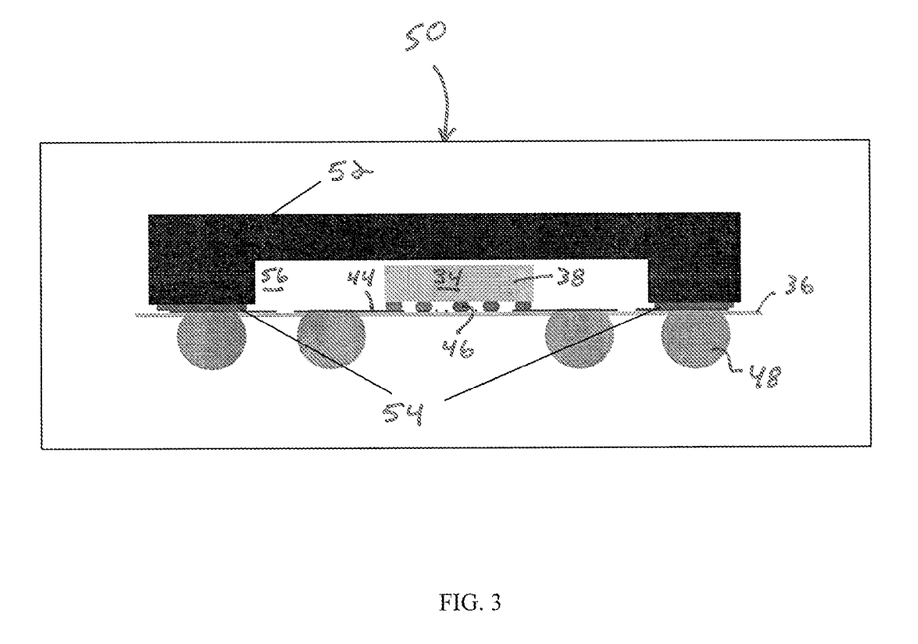
FIG. 3 is a schematic side view of a stiffener attached to the elastic carrier illustrated in FIG. 2.

FIG. 3 is a schematic side view of a semiconductor module 50 according to one embodiment. Semiconductor module 50 includes a stiffener 52 attached to carrier 36 along an interface 54. Stiffener 52 is configured to support elastic carrier 36 and enable handling of the flexibly mounted component 34. In general, stiffener 52 supports carrier 36 and prevents the elastic/flexible carrier 36 from undesirably dangling down and impeding subsequent testing and/or assembly of component 34. In one embodiment, stiffener 52 is provided to temporarily support semiconductor component 34 as external contacts 48 are electrically connected to an electronic tester when quality assurance testing component 34. In one embodiment, stiffener 52 is provided to assist in attaching carrier 36 to board 32 (FIG. 2) during final assembly of device 30, after which stiffener 52 is removed from carrier 36.

In one embodiment, stiffener 52 is provided as a rigid cap including a recess 56 configured to provide clearance for semiconductor component 34. In one embodiment, stiffener 52 is provided as a circular cap including a circular recess 56 sized to cover chip 38 without touching chip 38. In one embodiment, stiffener 52 is provided as a substantially rectangular strip or bridge that is open on opposing sides (one side is visible in the foreground and one side is not visible in the background of the view illustrated in FIG. 3) and configured to bridge over component 34 and support carrier 36.

Suitable material for fabricating stiffener 52 includes homogenous plastics, filled plastics, films, rigid caps, hard caps that can be selectively softened, or suction cups. In one embodiment, stiffener 52 is provided as a deep-drawn foil. In one embodiment, stiffener 52 is fabricated (molded or machined) from plastic and configured to be reusable.

Interface 54 attaches stiffener 52 to carrier 36. In one embodiment, interface 54 is provided as a bonding emulsion or glue configured to removably attach stiffener 52 to carrier 36. In one embodiment, interface 54 is a double-sided adhesive. In one embodiment, interface 54 is an attachment layer that is configured to be softened when heated, such that stiffener 52 is thermally removable from carrier 36. One suitable such attachment layer for interface 54 is solder. In one embodiment, interface 54 is configured to be removed when immersed in a solvent that removes or at least eliminates the tackiness of interface 54. In one embodiment, interface 54 is provided as a suction interface in which a vacuum applied to stiffener 52 captures carrier 36 against stiffener 52 along interface 54.

Stiffener 52 is provided as a handling mechanism that enables a user to test and ultimately install chip 38/carrier 36 onto board 32 (FIG. 2). In some embodiments, stiffener 52 includes grasping points, attachment points, or other handling mechanisms that enable the pick-and-place of stiffener 52 and component 34/carrier 36 to other devices.

Figure 4:
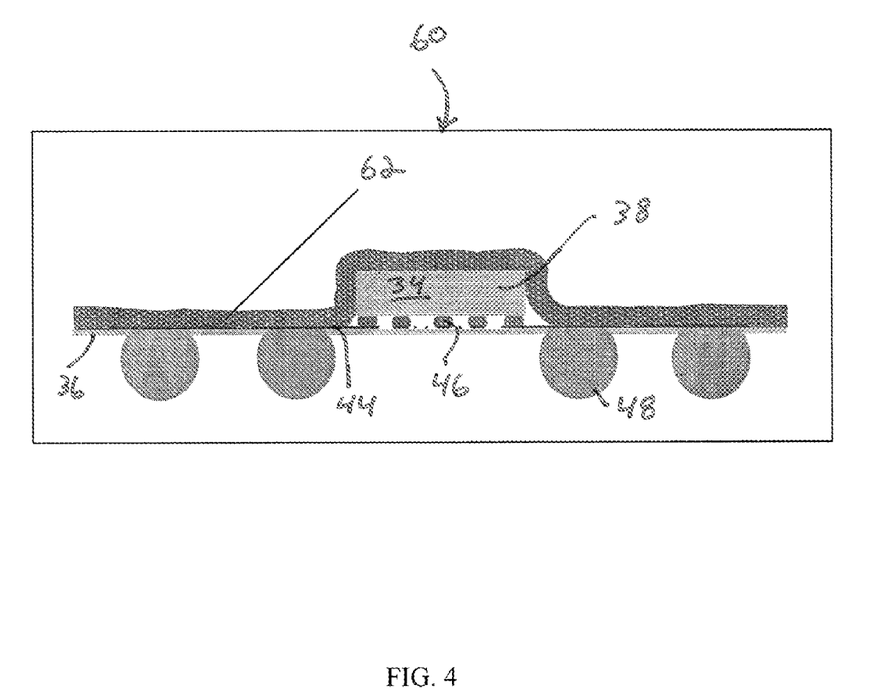
FIG. 4 is a schematic side view of a semiconductor module including a stiffener coated over an elastic carrier and a chip according to one embodiment.

FIG. 4 is a schematic side view of a semiconductor module 60 according to one embodiment. Semiconductor module 60 includes a stiffener 62 coated onto carrier 36. In one embodiment, stiffener 62 is provided as a temporary reinforcement layer that is hardened in place on carrier 36 and subsequently removed after attachment of carrier 36 to a circuit board, for example. In one embodiment, stiffener 62 is coated on carrier 36 by pouring, molding, or spraying a layer that hardens, for example by cross-linking, moisture curing, drying, or by evaporating solvent out of the coating. In one embodiment, such a coated stiffener 62 is removed from carrier 36 by washing or dissolving stiffener 62 in a suitable solvent, or by separation of stiffener 62 along its interface with carrier 36.

In one embodiment, semiconductor component 34 is attached to carrier 36 with chip contacts 46, and stiffener 62 is applied to that portion of carrier 36 not covered by component 34.

Figure 5:
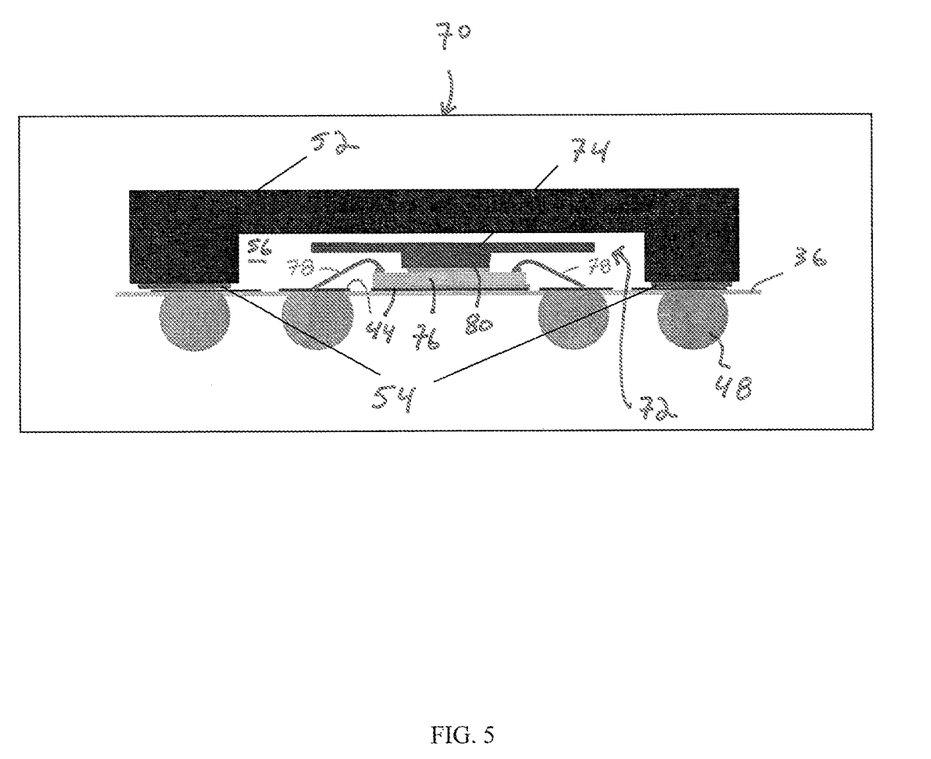
FIG. 5 is a schematic side view of a semiconductor module including a chip attached to an elastic carrier, a separate component attached to the chip, and a stiffener supporting the elastic carrier according to one embodiment.

FIG. 5 is a schematic side view of a semiconductor module 70 according to one embodiment. Semiconductor module 70 includes a semiconductor device 72 mounted to flexible carrier 36, and stiffener 52 supporting flexible carrier 36 for attachment of external contacts 48 to a circuit board or other electronic device. In one embodiment, semiconductor device 72 includes an element 74 attached to a semiconductor chip 76 that is bonded by wires 78 to contact pads 44.

In one embodiment, element 74 is provided as a separate component attachable to semiconductor chip 76. In one embodiment, element 74 is provided as a heat spreader and is attached to chip 76 along a thermally conductive interface 80. In general, element 74 is configured to remain on chip 76 after carrier 36 is connected to board 32 (FIG. 2) and stiffener 52 is removed. In one embodiment, element 74 is configured to protect wires 78 that bond chip 76 to pads 44. The recess 56 formed in stiffener 52 is generally sized to accommodate both chip 76 and element 74.

Figure 6:
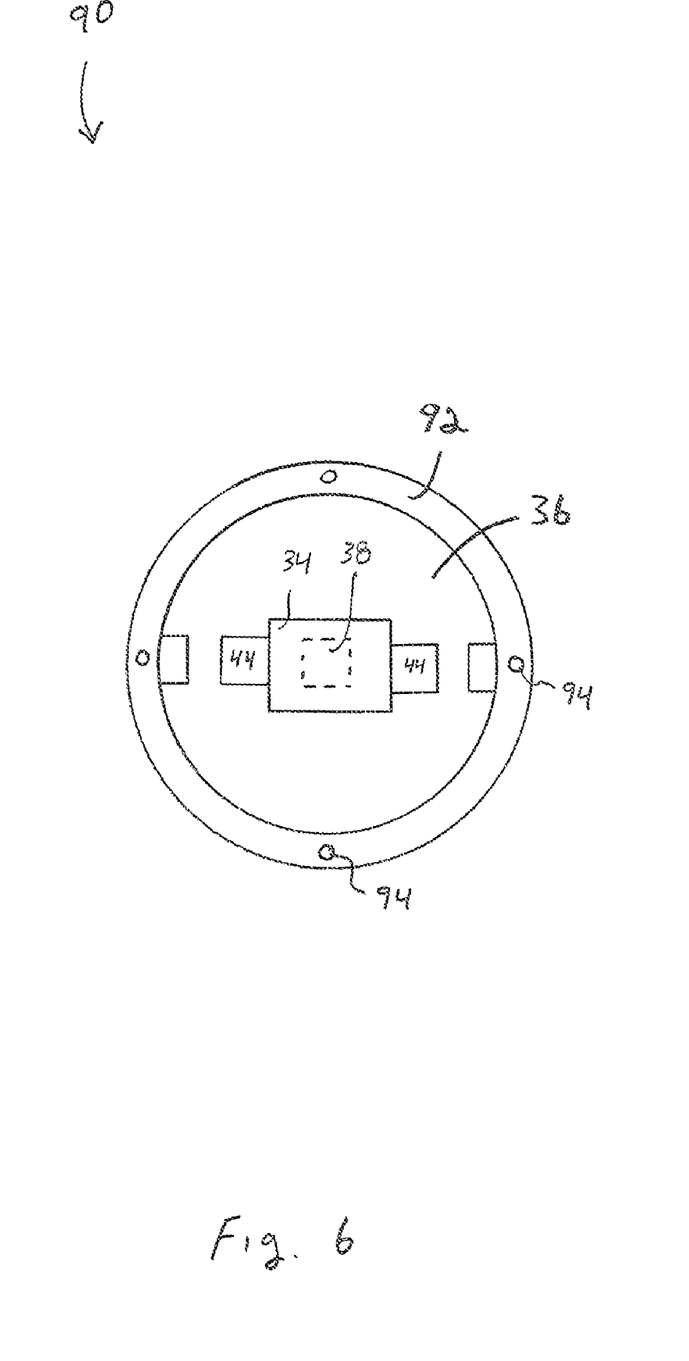
FIG. 6 is a top view of a stiffener ring attached to an elastic carrier according to one embodiment.

FIG. 6 is a top view of a semiconductor module 90 according to one embodiment. Semiconductor module 90 includes a stiffener ring 92 attached to and supporting elastic carrier 36. Although the stiffener 92 is illustrated as a circular ring attached to and supporting elastic carrier 36, it is to be understood that stiffener 92 may take other forms, such as rectangular/square stiffeners, stiffening bridges, symmetric stiffeners extending between opposing sides of component 34, or non-symmetric stiffeners extending between opposing sides of component 34. In one embodiment, stiffener ring 92 is attached to carrier 36 around a periphery of chip 38 and includes one or more grasping mechanisms 94 to be employed for removing ring 92 from carrier 36.

In one embodiment, stiffener ring 92 is provided as an "open" annular ring disposed around chip 38, substantially as illustrated. In one embodiment, stiffener ring 92 is provided as a "closed" cap that covers chip 38. Stiffener ring 92 is fabricated from plastic, foils, films, deep-drawn foils or the other suitable materials as described above.

In one embodiment, grasping mechanisms 94 include threaded holes configured to receive a threaded bolt attached to a removal device, although other forms of grasping mechanisms are also acceptable. For example, in one embodiment, grasping mechanism 94 is provided as a vacuum through-chamber configured to enable suction applied through stiffener 92 to support elastic carrier 36.

The stiffener (stiffener 52, 62, or 92) is eventually removed after elastic carrier 36 is attached to board 32 (FIG. 2).

Figure 7:
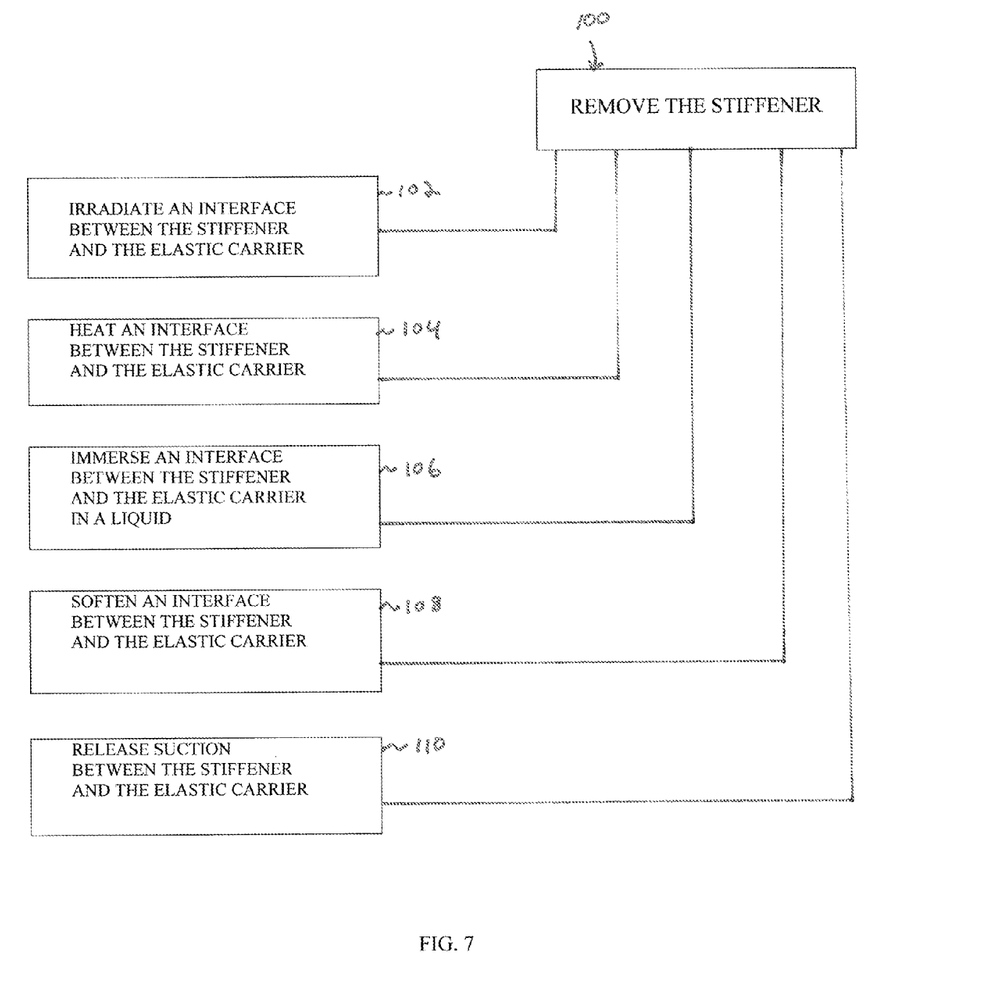
FIG. 7 is a block diagram illustrating various processes for removing a stiffener from an elastic carrier after attaching the elastic carrier to a board according to one embodiment.

FIG. 7 is a block diagram of processes 100 for removing any one of the stiffeners 52, 62, or 92 from carrier 36. In one embodiment, the stiffener is removed from the elastic carrier by irradiating the interface between the stiffener and the carrier 36 as provided at 102. For example, in one embodiment the interface is radiated with electromagnetic radiation of a suitable frequency to release the stiffener from the carrier.

In one embodiment, at 104 heat is provided to soften or remove the interface between the stiffener and the elastic carrier, for example when the stiffener is glued or soldered to carrier 36.

In one embodiment, at 106 the interface between the stiffener and elastic carrier 36 is immersed in a suitable solvent to weaken the attachment bond between the stiffener and the carrier.

In one embodiment, at 108 the interface between the stiffener and elastic carrier 36 is softened to release the stiffener from carrier 36. Suitable processes for softening the interface between the stiffener and carrier 36 include chemical deactivation/softening, mechanical deactivation/softening, or thermal deactivation/softening.

In one embodiment, at 110 the stiffener is separated from elastic carrier 36 by releasing suction applied through the stiffener to elastic carrier 36. Other mechanisms for removing the stiffener from elastic carrier 36 include thermal or mechanical removal of release liners, etc. After removal of the stiffener from elastic carrier 36, chip 38 and elastic carrier 36 are flexible and move relative to board 32 as best illustrated in FIG. 2.

Embodiments provide a stiffener that supports an elastic carrier for handling during testing and assembly. The stiffener minimizes movement of the elastic carrier to enable attachment of contacts between the carrier and a circuit board. The stiffener is removed after attachment of the carrier to the board, resulting in a semiconductor device being flexibly mounted to the board.

Embodiments provide devices and methods for mounting an elastic carrier to a circuit board and removing the supporting stiffener from the elastic carrier after attaching the elastic carrier to the board. Embodiments provide semiconductor devices having one or more semiconductor chips mounted to an elastic carrier where the chips are configured to move relative to a circuit board to which the carrier is connected. The flexible mounting of the semiconductor chips to the circuit board permits the chips to move relative to the board during use without cracking or fatiguing the connections between the chip and its package, and without cracking or fatiguing the connections between the package and the board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of the handling and mounting of flexible carriers for semiconductor devices as discussed herein. Therefore, it is intended that this invention be limited only by the claims and the equivalents thereof.

What is claimed is:

1. A method of assembling a semiconductor device comprising:
    providing a chip attached to an elastic carrier;
    supporting the elastic carrier with a stiffener; and
    removing the stiffener from the elastic carrier after attaching the elastic carrier to a board.

2. The method of claim 1, wherein the stiffener comprises a rigid cap attachable to the elastic carrier.

3. The method of claim 2, wherein the rigid cap comprises a recess configured to receive the chip.

4. The method of claim 1, wherein the stiffener covers the chip and a portion of the elastic carrier.

5. The method of claim 1, wherein supporting the elastic carrier with a stiffener comprises at least one of gluing, soldering, mechanically interlocking, and suctioning a stiffener to the elastic carrier.

6. The method of claim 1, wherein supporting the elastic carrier with a stiffener comprises attaching the stiffener to the elastic carrier on opposing sides of the chip.

7. The method of claim 6, comprising attaching the stiffener to the elastic carrier around a perimeter of the chip.

8. The method of claim 1, wherein removing the stiffener comprises one of irradiating an interface between the stiffener and the elastic carrier, heating an interface between the stiffener and the elastic carrier, immersing an interface between the stiffener and the elastic carrier in a liquid, and softening an interface between the stiffener and the elastic carrier.

9. The method of claim 1, wherein removing the stiffener from the elastic carrier comprises configuring the chip and the elastic carrier to move relative to the board.

10. A method of handling a semiconductor module, the method comprising:
    attaching a chip to a flexible carrier;
    attaching at least one contact element to the flexible carrier;
    attaching a stiffener to the flexible carrier;
    handling the stiffener and attaching the at least one contact element to a board; and
    removing the stiffener from the flexible carrier such that the chip is flexibly mounted to the board.

11. The method of claim 10, wherein attaching a stiffener to the flexible carrier comprises attaching a rigid cap over the chip and to the flexible carrier.

12. The method of claim 10, wherein attaching a stiffener to the flexible carrier comprises depositing a rigid coating over the chip and to the flexible carrier.

13. The method of claim 10, further comprising:
    attaching at least one component to the chip opposite the flexible carrier.

14. The method of claim 13, wherein the at least one component comprises a heat spreader.

15. A semiconductor device comprising:
    a circuit board;
    a elastic carrier comprising a first face opposite a second face, the first face attached to the circuit board with external contacts; and
    a semiconductor chip attached to the second face of the elastic carrier with chip contacts;
    wherein the elastic carrier configures the chip to move relative to the circuit board.

16. The semiconductor device of claim 15, wherein the elastic carrier is configured to maximize strain between the semiconductor chip and the circuit board.

17. The semiconductor device of claim 15, wherein the elastic carrier is configured to minimize cracking of the external contacts and the chip contacts.

18. The semiconductor device of claim 15, wherein the elastic carrier comprises a modulus of elasticity between approximately 2-12 kN/mm$^2$.

19. The semiconductor device of claim 15, further comprising:
    a component attached to the semiconductor chip opposite the elastic carrier.

20. The semiconductor device of claim 15, characterized by an absence of encapsulation material disposed around the semiconductor chip such that the semiconductor chip is movable relative to the external contacts.

21. A semiconductor module configured for attachment to a circuit board, the semiconductor module comprising:
    an elastic carrier comprising a first face opposite a second face;
    external contacts attached to the first face of the elastic carrier;
    a semiconductor chip attached to the second face of the elastic carrier with chip contacts; and
    a stiffener removably coupled to the second face of the elastic carrier;
    wherein the stiffener is configured to minimize movement of the elastic carrier when attaching the external contacts to the circuit board.

22. The semiconductor module of claim 21, wherein the stiffener comprises a rigid cap configured to extend over a top surface of the semiconductor chip.

23. The semiconductor module of claim 21, wherein the stiffener comprises a rigid ring disposed around a periphery of the semiconductor chip.

24. The semiconductor module of claim 22, wherein the stiffener comprises a grasping mechanism configured to enable removal of the stiffener from the elastic carrier.

25. The semiconductor module of claim 21, wherein the stiffener comprises a removable coating applied to the semiconductor chip and a portion of the second face of the elastic carrier not covered by the semiconductor chip.

* * * * *